United States Patent [19]

Shigehara et al.

[11] Patent Number: 5,493,233
[45] Date of Patent: Feb. 20, 1996

[54] MOSFET CIRCUIT APPARATUS WITH AVALANCHE BREAKDOWN PREVENTION MEANS

[75] Inventors: Hiroshi Shigehara, Tokyo; Masanori Kinugasa, Yokohama, both of Japan

[73] Assignee: Kabushiki Kaisha Toshiba, Japan

[21] Appl. No.: 353,397

[22] Filed: Dec. 2, 1994

[30] Foreign Application Priority Data

Dec. 2, 1993 [JP] Japan ................................. 5-302816

[51] Int. Cl.⁶ ............................................. H03K 17/16
[52] U.S. Cl. ............................. 326/27; 326/81; 326/121; 327/534
[58] Field of Search ........................... 326/27, 81, 121; 327/534, 537, 541

[56] References Cited

U.S. PATENT DOCUMENTS

| | | | |
|---|---|---|---|
| 4,506,164 | 3/1985 | Higuchi | 326/81 |
| 4,956,569 | 9/1990 | Olivio | 326/81 |
| 4,963,766 | 10/1990 | Lundberg | 326/81 |
| 5,338,978 | 9/1994 | Larsen et al. | 327/534 |
| 5,381,056 | 1/1995 | Murphy | 327/534 |
| 5,381,061 | 1/1995 | Davis | 327/534 |
| 5,382,846 | 1/1995 | Shigehara | 326/121 |
| 5,396,128 | 3/1995 | Dunning | 327/534 |

FOREIGN PATENT DOCUMENTS 5-37336  2/1993  Japan.
5-167427  7/1993  Japan.

OTHER PUBLICATIONS

Publication, "Physics and Technology of Semiconductor Devices", A. S. Grove (John Wiley and Sons, Inc., 1976, pp. 231–233.

*Primary Examiner*—Edward P. Westin
*Assistant Examiner*—Andrew Sanders
*Attorney, Agent, or Firm*—Banner & Allegretti, Ltd.

[57] ABSTRACT

A transistor circuit apparatus comprises a MOS transistor to be improved, for preventing an avalanche breakdown, the MOS transistor being connected in a channel conductor path provided between one of power supply terminals and a terminal of an output, a separate circuit connected to the output terminal and driven by a voltage from a separate power supply, and a pull-down unit including a second transistor connected between one of said power supply terminals and a back gate of the MOS transistor, the second transistor being turned on with an output node of the separate circuit used as power supply when the MOS transistor remains at a ground potential level with no power supply potential supplied, thereby pulling down the potential level of a back gate node of the MOS transistor to the level of one of the power supply terminals.

9 Claims, 5 Drawing Sheets

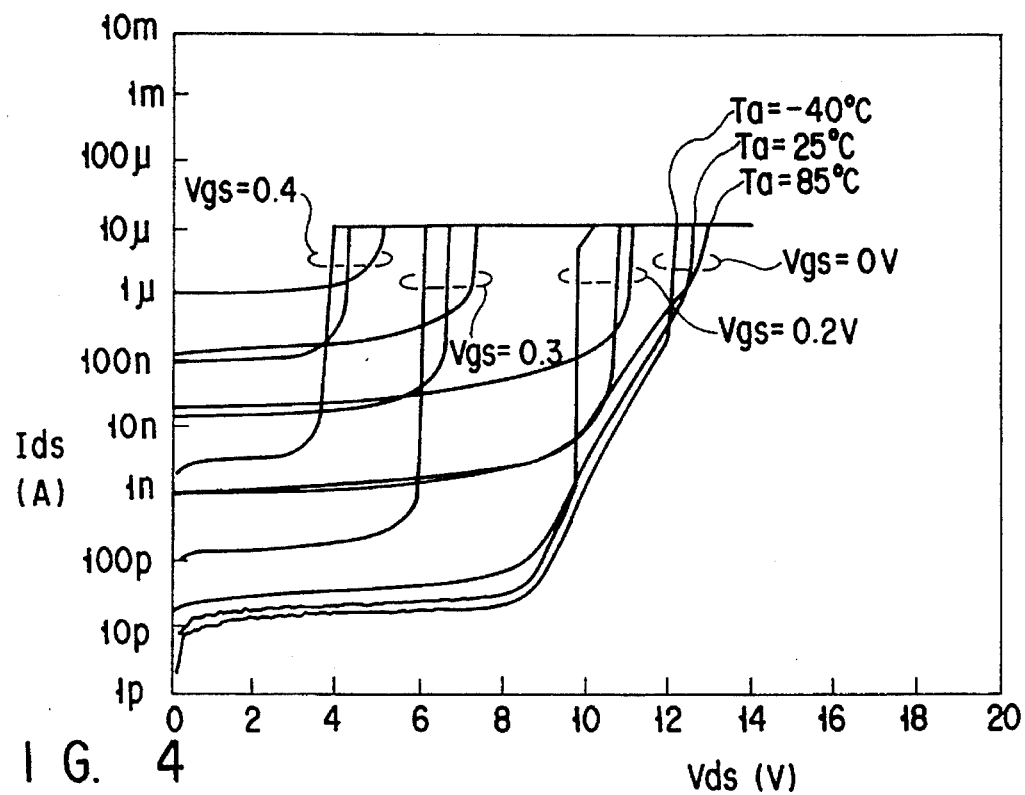
F I G. 4
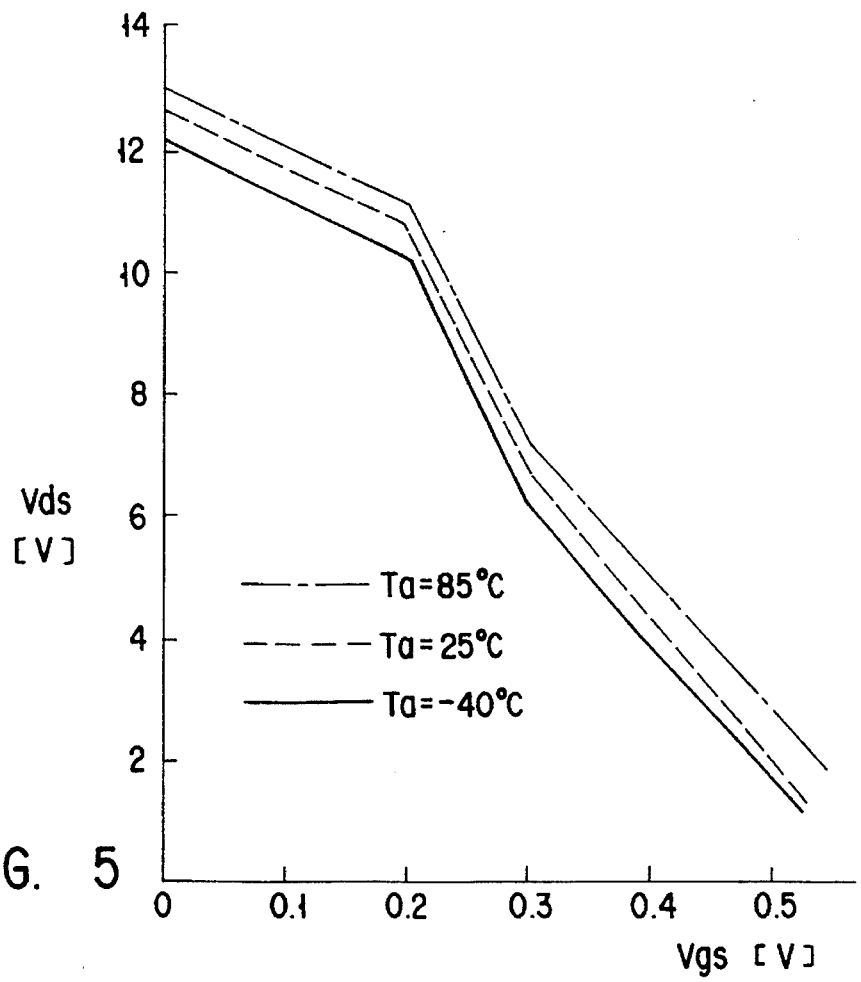
F I G. 5

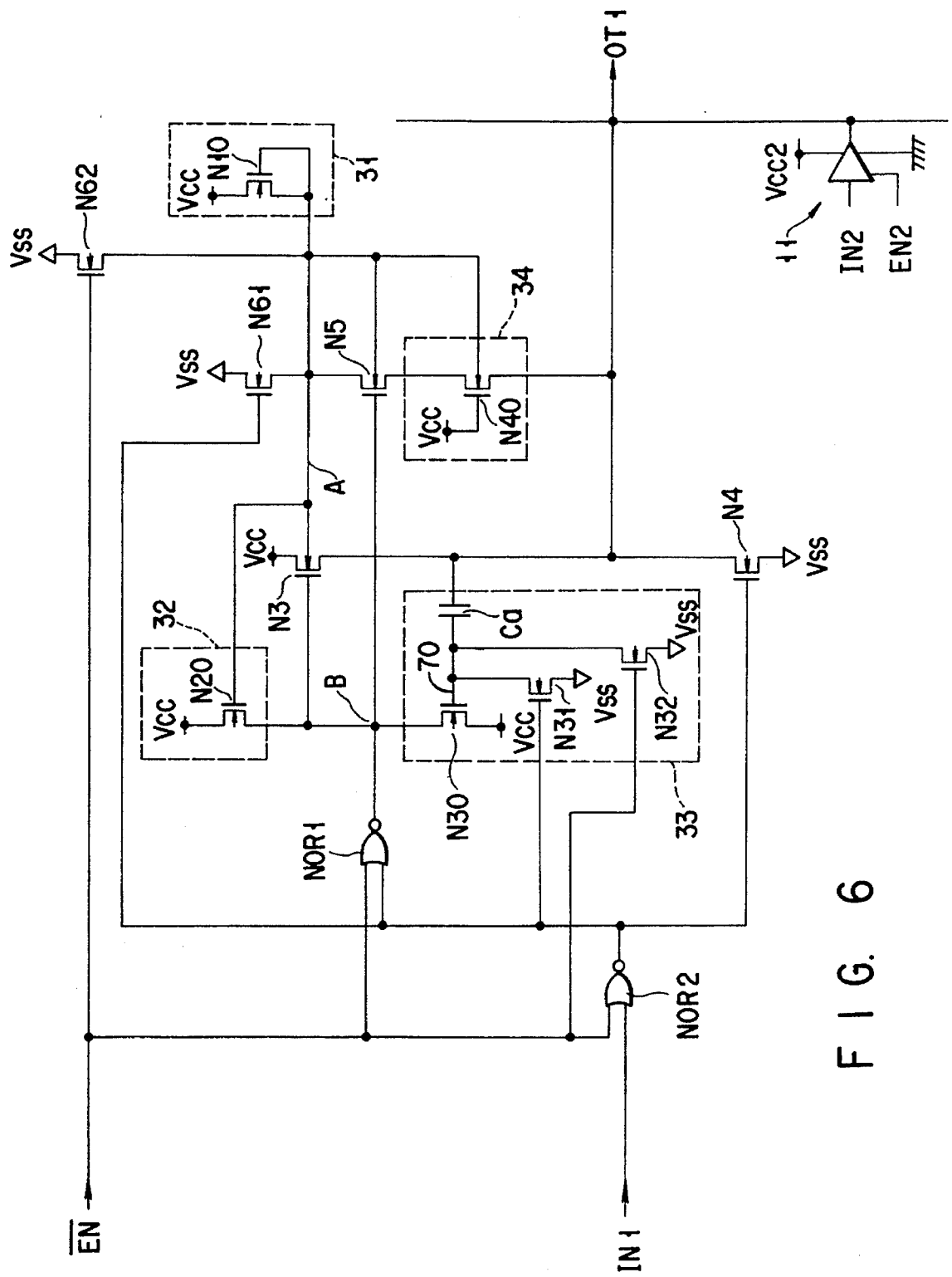
F I G. 6

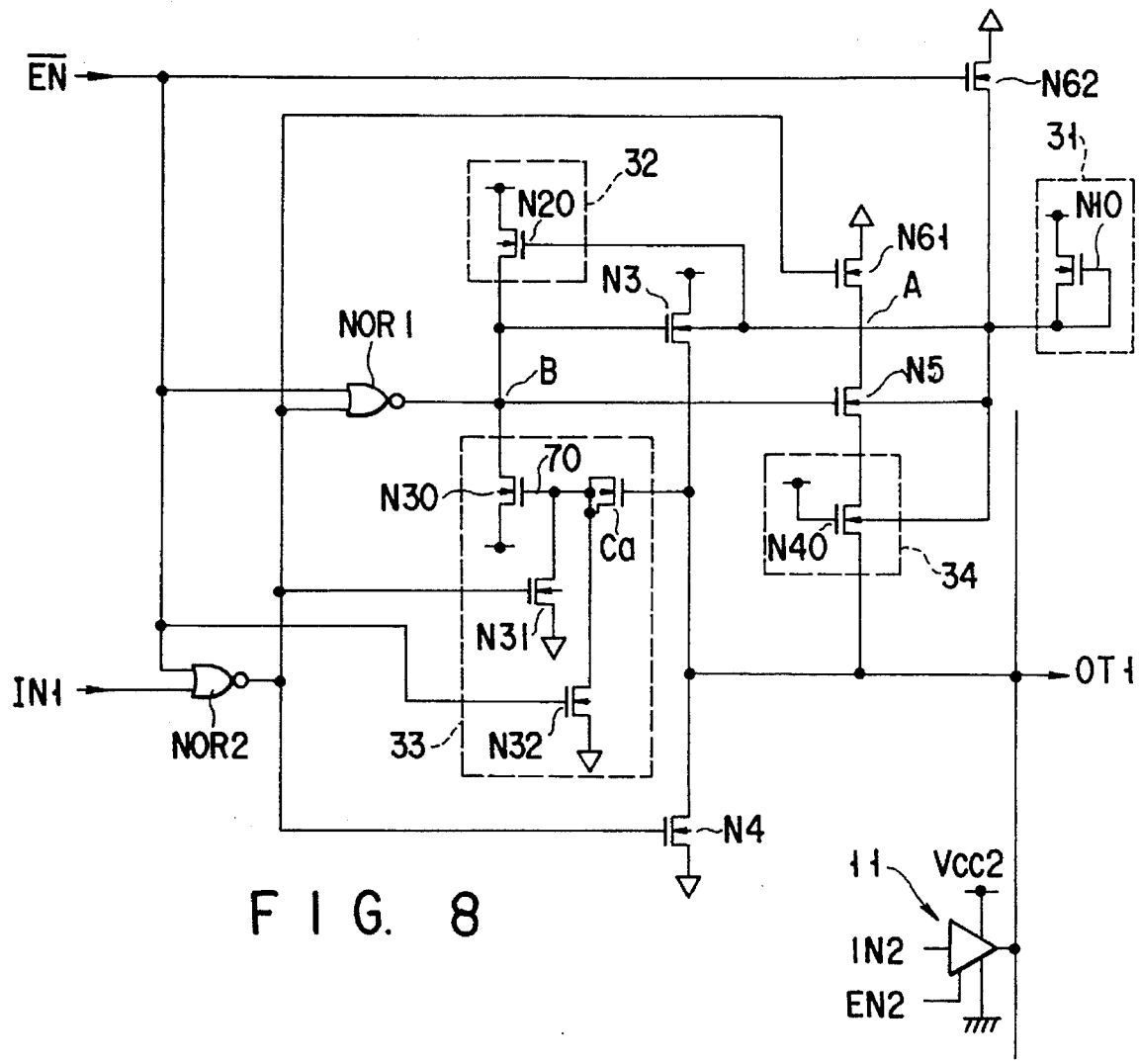
F I G. 8
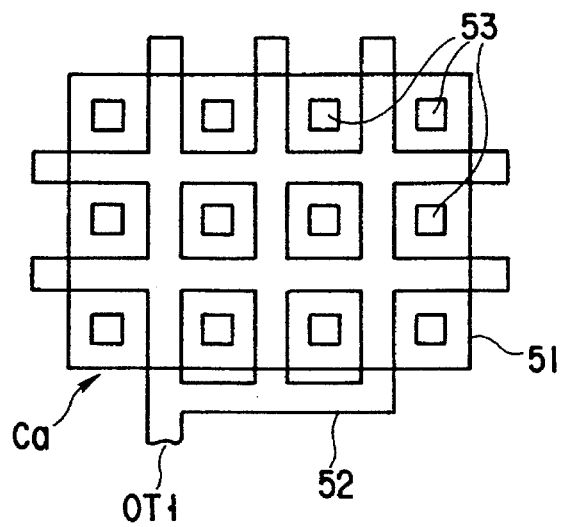
F I G. 9 to the circuit 11 in FIG. 1.

MOSFET CIRCUIT APPARATUS WITH AVALANCHE BREAKDOWN PREVENTION MEANS

BACKGROUND OF THE INVENTION

1. Field of the Invention

The present invention relates to a transistor circuit apparatus wherein a drain-source breakdown voltage of a MOS transistor is improved, thereby preventing an avalanche breakdown.

2. Description of the Related Art

It is generally known that with a bipolar transistor, if a collector-emitter voltage is applied while a base is being opened, an avalanche breakdown occurs when a voltage value reaches a certain level, and as a result a large current flows across the collector and emitter. The reason for this is that a dark current flowing across the collector and emitter causes an electron avalanche phenomenon in a base region, and an excessively large current flows. This phenomenon is stated, for example, in "Physics and Technology of Semiconductor Devices", A. S. Grove (John Wiley and Sons, Inc. 1976, pp. 231–233).

On the other hand, the inventors of the present invention have already proposed an NMOS output circuit wherein a back gate bias effect compensation was effected (Jap. Pat. Appln. KOKAI No. 5-37336).

FIGS. 1 and 2 show examples of a conventional transistor circuit apparatus. FIG. 1 shows a non-inversion type tri-state output circuit, and FIG. 2 shows a non-inversion type bi-state output circuit.

FIG. 1 shows a circuit configuration for effecting a control wherein transistors N3 and N4 are controlled by NOR circuits NOR1 and NOR2, thereby producing an output OT1 having the same phase as an input IN1 or setting the output OT1 in a high-impedance state.

In FIG. 2, transistors N3 and N4 are controlled by inverters IV1 and IV2, thereby producing an output OT1 having the same phase as an input IN. The output OT1 is pulled up to Vcc2 by a resistor R. The resistor R corresponds to a circuit 11 in FIG. 1.

For example, in the NMOS output circuit shown in FIG. 1, suppose that a power supply voltage Vcc (=Vcc1) is short-circuited to a ground potential Vss, i.e. a power supply is set in a turned-off state. In addition, suppose that an I/O bus line is supplied with a signal from the circuit 11 driven by a power supply Vcc2 which is different from Vcc1.

Specifically, the I/O bus line is shared by circuits connected to two power supply systems (Vcc=Vcc1; Vcc2).

In this case, Vcc=Vss and the gate (front gate) potentials of NMOS transistors N3, N4, N5, N61 and N62 are set at ground potential Vss. Thus, the gate-source voltage Vgs of these NMOS transistors N3, N4, N5, N61 and N62 is 0V, and these transistors are turned off. In other words, the back gates (node A) of the NMOS transistors N3 and N5 are set in a high impedance state.

Accordingly, the base of a parasitic npn bipolar transistor constituted by the drain, back gate and source of the NMOS transistor N3 shown in FIG. 1 is in the open state (i.e. at a potential in the open state).

In this state, if a signal is supplied to the I/O bus line OT1 from the circuit 11 driven by the power supply Vcc2, the aforementioned avalanche occurs when the supplied signal is at high level. The breakdown voltage at this time is determined by properties of device structure such as an impurity concentration in the base. Once the device structure is determined, improvement in breakdown voltage is difficult.

The state just after the power supply Vcc has been short-circuited to Vss will now be considered with reference to FIG. 1. The voltage at node A, which was at the Vcc level just before the short (turn-off of power supply), is changed towards the Vss level by the parasitic diode formed between the Vcc and node A. However, since the NMOS transistor N3, by which the voltage at node A is to be varied towards the Vss, is turned off, the voltage at node A does not immediately decrease below a level close to a diode forward voltage (about 0.4V).

However, after the voltage at node A reaches this level, the node voltage gradually goes to the Vss level by leak current.

On the other hand, it is not known that when a little charge remains in the gate of the NMOS transistor (i.e. node B corresponding to the gate of transistor N100 in FIG. 3), the avalanche breakdown voltage of the parasitic bipolar transistor (constituted by the source, back gate and drain) decreases, as will be described below.

FIG. 3 shows a measuring circuit using an NMOS transistor N100 the back gate (i.e. P-well substrate) of which is set in the open state. For example, by using this measuring circuit, the relationship between the drain-source voltage Vds and drain-source current Ids in the case where Vgs (=0V, 0.2V, 0.3V, 0.4V) was applied to the gate of the transistor N100 was examined. As is shown in FIG. 4, it was confirmed that the drain-source voltage Vds decreased and this fact (decrease of avalanche breakdown voltage) was confirmed.

In the employed sample of the NMOS transistor N100, threshold voltage Vth=0.6V and W/Leff=630 µm/1.0 µm (W=channel width; Leff=effective channel length). Symbol B1 denotes a npn bipolar transistor parasitic on the NMOS transistor N100.

FIG. 4 shows measurement results obtained with measuring circuit of FIG. 3, including temperature dependency (Ta=−40°, 25°, 85° C.). As is clear from FIG. 4, the current Ids flows abruptly if the variable gate potential Vgs has reached the drain-source potential Vds in each case.

In order to prevent device destruction due to a very large current (i.e. breakdown current mentioned below), a current limit was provided at 10 µA in the measurement. However, the occurrence of breakdown is clearly understood from a sudden increase in current Ids representing characteristics in this graph.

When the gate-source voltage Vgs=0V, the avalanche breakdown voltage of the bipolar transistor itself is observed. However, it is understood from the decrease in drain-source potential Vds that if Vgs>0V, the breakdown voltage decreases.

FIG. 5 shows the relationship between the breakdown voltage Vds and gate potential Vgs, which was found from the measurement result as shown in FIG. 4. Specifically, when a positive gate voltage is applied to the gate of the transistor N100, the energy band structure at the semiconductor surface just below the gate and the charge distribution are changed. Consequently, a sub-threshold current flows below the gate. This current triggers an avalanche breakdown on the semiconductor surface at the lower gate voltage Vds.

In FIG. 1, the gate of transistor N3 is a common node. This, too, causes the decrease in breakdown voltage, as described below.

In FIG. 1, if a residual potential component is included in the gate potential of the transistor N5 just after the power supply Vcc was short-circuited to Vss, a sub-threshold current thereof acts as a carrier current. When the potential of the output node OT1 is raised, the sub-threshold current raises the potential of point A, i.e. P-well potential, via the source-drain path of the transistor N5 and causes an avalanche breakdown.

Thus, the avalanche breakdown voltage is lowered and the avalanche breakdown is likely to occur.

As has been described above, the avalanche breakdown voltage decreases abruptly due to a little residual potential. Thus, if one of the two power supply systems (Vcc=Vcc1, Vcc2) is turned off (i.e. Vcc=Vss), the normal operation cannot be expected.

Even if there is no residual potential, if a pulse is applied to the I/O bus line OT1, a charge is injected in the gate by a mirror capacitance created between the gate and source and between the gate and drain of the NMOS transistor N3.

Consequently, the gate potential of the transistor N3 rises, as in the case where the aforementioned residual potential is present. Accordingly, the avalanche breakdown voltage falls abruptly. Therefore, if one of the two power supply systems (Vcc=Vcc1, Vcc2) is turned off (i.e. Vcc=Vss), the normal operation cannot be expected.

SUMMARY OF THE INVENTION

The present invention has been made in consideration of the above problems, and an object of the invention is to provide a transistor circuit apparatus wherein even if one of power supply systems is rendered non-conductive (e.g. when Vcc=Vss with power supply turned off, as mentioned above), an avalanche breakdown voltage can be improved by merely adding a small number of MOS transistors, without changing a device structure, thereby preventing an avalanche breakdown.

In order to achieve the above object, according to an aspect of the invention, there is provided a transistor circuit apparatus comprising:

a first MOS transistor to be improved, for preventing an avalanche breakdown of a parasitic bipolar transistor, the first MOS transistor being connected in a channel conductor path provided between one of power supply terminals Vcc and Vss and an output terminal;

a separate circuit connected to the output terminal and driven by a voltage from a separate power supply; and a first pull-down unit including a second transistor connected between one of the power supply terminals Vcc and Vss and a back gate of the first MOS transistor, the second transistor being turned on with an output node of the separate circuit used as power supply when the first MOS transistor remains at a ground potential level with no power supply potential supplied, thereby pulling down the potential level of a back gate node of the first MOS transistor to the level of one of the power supply terminals Vcc and Vss.

According to another aspect of the invention, there is provided a transistor circuit apparatus comprising:

a first MOS transistor to be improved, for preventing an avalanche breakdown of a parasitic bipolar transistor, the first MOS transistor being connected in a channel conductor path provided between one of power supply terminals Vcc and Vss and an output terminal;

a separate circuit connected to the output terminal and driven by a voltage from a separate power supply; and a pull-down unit including a second transistor connected in a channel conductor path provided between one of the power supply terminals Vcc and Vss and a front gate of the first MOS transistor, a front gate of the second transistor being connected to the back gate of the first MOS transistor, the second transistor being turned on with an output node of the separate circuit used as power supply when the first MOS transistor remains at a ground potential level with no power supply potential supplied, thereby pulling down the potential level of the back gate node of the first MOS transistor to the level of one of the power supply terminals Vcc and Vss.

According to still another aspect of the invention, there is provided a transistor circuit apparatus comprising:

a first MOS transistor to be improved, for preventing an avalanche breakdown of a parasitic bipolar transistor, the first MOS transistor being connected in a channel conductor path provided between one of power supply terminals Vcc and Vss and an output terminal;

a separate circuit connected to the output terminal and driven by a voltage from a separate power supply; and a pull-down unit including a second transistor connected in a channel conductor path provided between one of the power supply terminals Vcc and Vss and a front gate of the first MOS transistor, a front gate of the second transistor detecting a potential variation of the output terminal, the second transistor being turned on with an output node of the separate circuit used as power supply when the first MOS transistor remains at a ground potential level with no power supply potential supplied, thereby pulling down the potential level of the back gate node of the first MOS transistor to the level of one of the power supply terminals Vcc and Vss.

According to still another aspect, there is provided a transistor circuit apparatus comprising:

a first MOS transistor to be improved, for preventing an avalanche breakdown of a parasitic bipolar transistor, the first MOS transistor being connected in a channel conductor path provided between one of power supply terminals Vcc and Vss and an output terminal;

a separate circuit connected to the output terminal and driven by a voltage from a separate power supply; and a path cut unit including a second transistor, connected in series between a back gate voltage compensation transistor connected to the back gate of the first MOS transistor and the output terminal, for cutting a path of a leak current.

With the above structure of the transistor circuit apparatus of the invention, it is possible to prevent an avalanche breakdown due to a source-drain parasitic capacitance of the first MOS transistor to be improved, connected in the channel conductor path provided between one of the power supply terminals Vcc and Vss and the output terminal.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a graph showing a test result of transistor characteristics obtained by the testing circuit of FIG. 3;

FIG. 5 is a graph showing a relationship between a transistor breakdown voltage and a gate voltage, obtained from the graph of FIG. 4;

FIG. 6 shows the structure of a transistor circuit according to an embodiment of the present invention;

FIG. 8 shows the structure of a transistor circuit according to another embodiment of the present invention; and FIG. 9 shows a specific structure for forming a capacitance Ca shown in FIG. 8.

DETAILED DESCRIPTION OF THE PREFERRED EMBODIMENTS

Preferred embodiments of the present invention will now be described with reference to the accompanying drawings, in particular, FIGS. 6 to 9.

Figure 1:
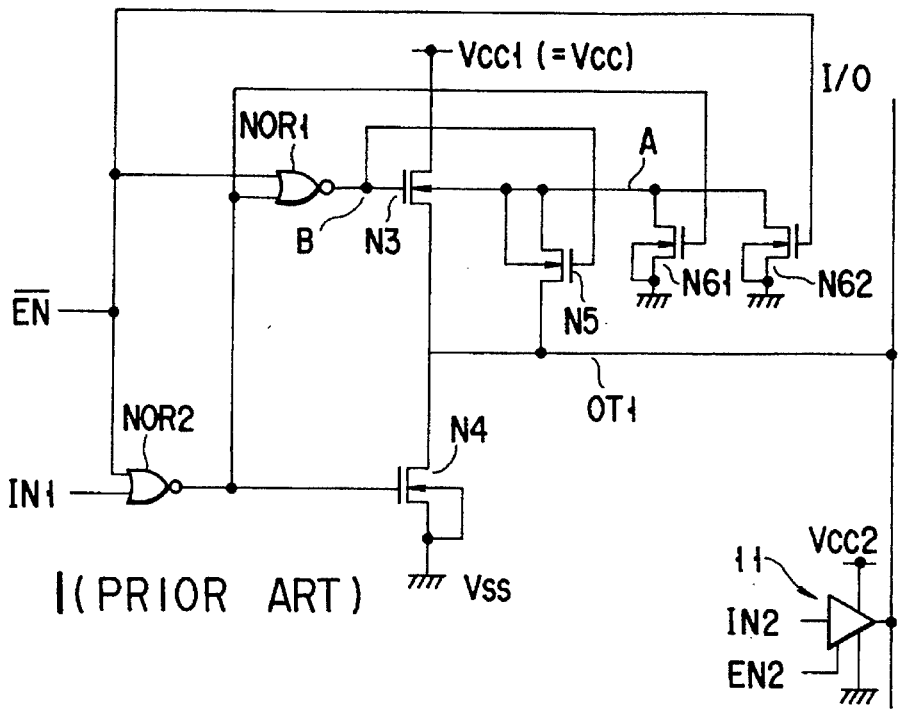
FIG. 1 shows the structure of a conventional non-inversion tri-state output circuit or a transistor circuit apparatus.

In an embodiment shown in FIG. 6, first to fourth improvement means are provided on the first transistor N3 in the conventional non-inversion tri-state output circuit shown in FIG. 1, thereby preventing an avalanche breakdown.

The first improvement means is an NMOS transistor N10 constituting a part of a pull-down unit 31. The second improvement means is an NMOS transistor 20 constituting a part of a pull-down unit 32. The third means is an NMOS transistor N30 constituting a part of a pull-down unit 33. The fourth improvement means is an NMOS transistor 40 for off-leak cut, inserted between the back-gate compensation NMOS transistor N5 provided for the first transistor N3 to be improved and the drain of the first transistor N3. These transistors are connected to the first transistor N3 to be improved.

The first to fourth improvement means will now be described successively.

As regards the first improvement means or the NMOS transistor N10 constituting a part of the pull-down unit 31, the source and drain of the NMOS transistor N10 are connected between the P-well node A and a power supply Vcc. The front gate of the transistor N10 is connected to the P-well node A. The back gate of the transistor N10 is connected to a ground potential Vss.

Thus, under the condition of operation of the first NMOS transistor N3 to be improved, to which the power supply Vcc is supplied, the gate-source voltage Vgs of the transistor N10 is 0V and the transistor N10 is turned off. In this case, one end of the transistor 10 may be connected to Vss, and not to Vcc.

Figure 7:
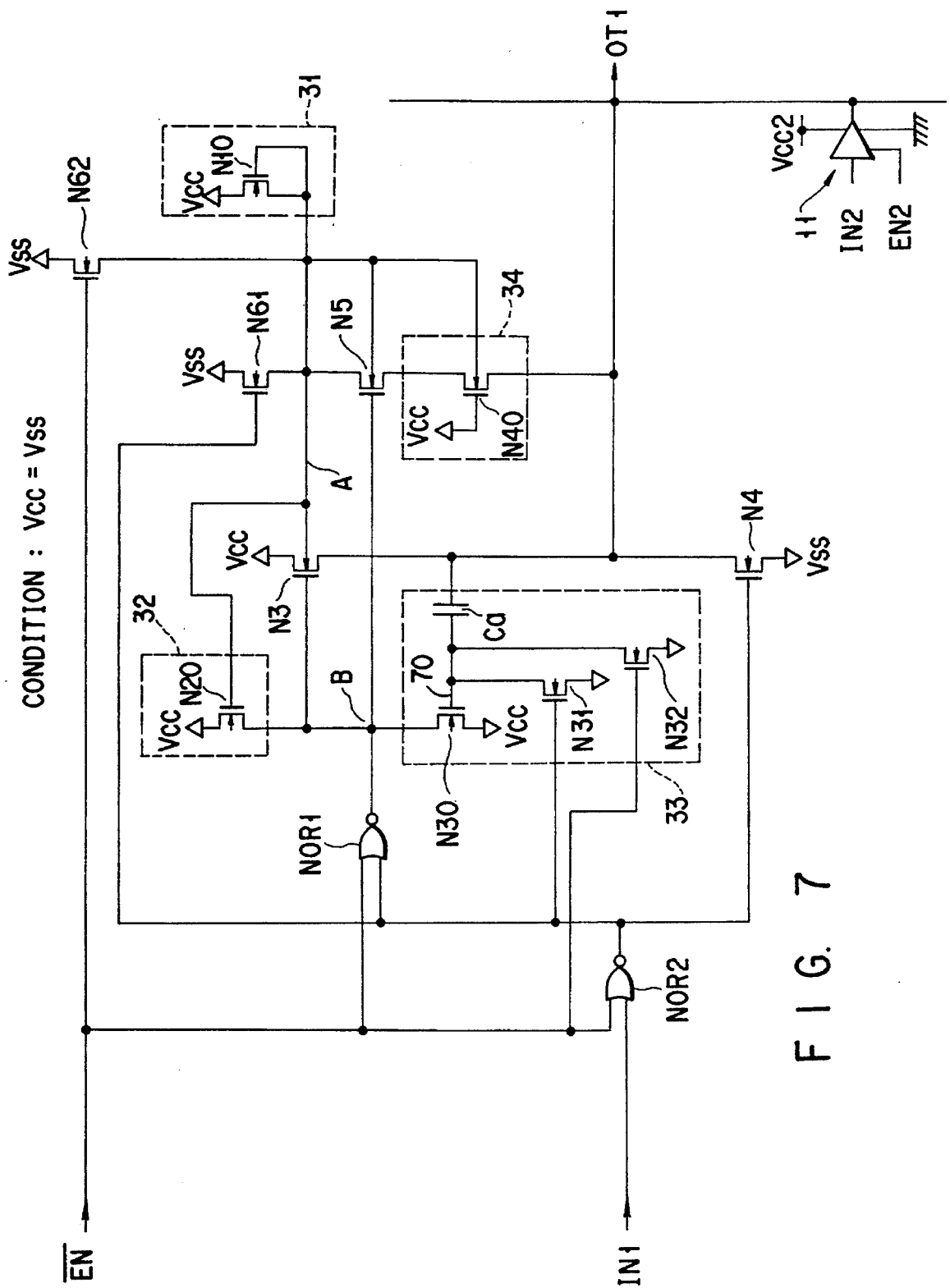
FIG. 7 illustrates the operation of the circuit of FIG. 6.

FIG. 7 shows the state of the circuit of FIG. 6 when a voltage, which does not permit normal operation of the circuit, has been applied to the circuit of FIG. 6, e.g. Vcc=Vss (power supply is turned off). FIG. 7 shows that if a voltage higher than Vss is applied to the output node OT1, an avalanche breakdown is prevented.

Specifically, the potential of output OT1 is increased by the circuit 11 shown in FIG. 6. The potential of the base (point A) of the parasitic bipolar transistor of the MOS transistor N3 is increased by a dark current flowing when the parasitic diode provided between the output OT1 and P-well is reversely biased. If the potential of node A becomes higher than the threshold voltage of the transistor N10, the transistor N10 is turned on abruptly and pulls down the level of the node A to Vss via the transistor N10. In other words, the base of the parasitic bipolar transistor is pulled down to Vss by a resistance component of the transistor N10.

Regarding the above, in the conventional circuit configuration as shown in FIG. 1, the point A is set at high impedance state, and all the slight current flowing from the output node OT1 (collector) to the P-well (base) enters the Vcc node (emitter) set at Vss level. The slight current is accelerated through the intervening electric field and the avalanche breakdown occurs. Since a secondary carrier occurs, the potential of the P-well (point A) increases abruptly owing to the avalanche breakdown. This means that the amount of current flowing from the P-well (point A) to the Vss (=Vcc) also increases abruptly, and this phenomenon is regarded as problem.

According to the above-described first improvement means, 1) the potential level of the P substrate (i.e. base node of the parasitic bipolar transistor) of the first NMOS transistor N3 to be improved is pulled down to the emitter-side potential (Vcc=Vss) of the bipolar transistor by using the NMOS transistor N10 functioning as diode. Since the NMOS transistor N10 is turned on, the current flowing out of the collector or secondary carrier is bypassed by the NMOS transistor N10 and the potential of the P-well (base), which may be increased by the current from the collector or secondary carrier, is prevented from increasing. As a result, the avalanche breakdown can be prevented.

As regards the second improvement means or the NMOS transistor 20 constituting a part of the pull-down unit 32, the source and drain thereof are connected between the gate of the first NMOS transistor N3 to be improved and the Vcc. The gate of the transistor 20 is connected to the node A.

The back gate of the NMOS transistor 20 is connected to the Vss. Thus, under the condition of operation in which the power supply potential for the transistor 20 is supplied to Vcc, when the NMOS transistor N3 is turned on by the output from the NOR circuit NOR1, the gate potential of the NMOS transistor N3 is Vcc. At the same time, since the back-gate voltage compensation transistor N5 is turned on, the gate potential at the NMOS transistor 20 which has passed through the NMOS transistor N40 is higher than Vss.

Although the NMOS transistor N20 is turned on, the drain potential is equal to the source potential (output of NOR1 is Vcc). There is no problem in which a penetration current flows between Vcc and Vss from the NMOS transistor N20 via the NMOS transistor of the NOR circuit NOR1.

When the first NMOS transistor N3 to be improved is turned off, the transistor N5 is also turned off and at least one of the inputs of the NOR circuit NOR1 is at high level. Thus, either the transistor N61 or N62 is turned on, and the potential of node A is Vss level. Accordingly, the gate potential of the NMOS transistor N20 is Vss. Since the gate potential of the first transistor N3 is Vss, the source of the NMOS transistor N20 is Vss, too.

Accordingly, the gate-source voltage Vgs of the NMOS transistor N20 is 0V and the NMOS transistor 20 is turned off. Thus, there is no problem in which a penetration current flows between Vcc and Vss from the NMOS transistor N20 via the NMOS transistor of the NOR circuit NOR1.

As is understood from the circuit operation illustrated in FIG. 7, if the potential of the P-well (point A) has increased abruptly above the threshold voltage of the transistor N20, the NMOS transistor N20 is turned on abruptly and the gate potential of the NMOS transistor N3 is pulled down to Vss.

Thus, the residual charge at the gate of the NMOS transistor N3 is escaped to Vss (=Vcc), and the breakdown voltage is improved to an avalanche breakdown voltage produced in the case of the absence of residual charge. Once the residual charge is eliminated, the avalanche breakdown voltage is kept at high value unless the gate potential of the NMOS transistor N3 rises for some reason. Even if the gate potential of transistor N3 rises, the NMOS transistor N20 operates once again. As a result, a decrease in avalanche breakdown voltage due to residual charge can be prevented.

According to the second improvement means, 2) the NMOS transistor N20 having a base (P-substrate) potential equal to a potential of a gate signal is connected to the gate of the first NMOS transistor N3 to be improved. Once an avalanche breakdown has occurred, the gate potential is controlled in accordance with the increase in base potential so that the gate-source voltage Vgs becomes 0V, and the potential level of the gate of the NMOS transistor N3 is pulled down to the emitter potential (Vcc=Vss) of the aforementioned parasitic transistor. Thereby, a decrease in avalanche breakdown voltage is prevented.

As regards the third improvement means or the NMOS transistor N30 constituting a part of the pull-down unit 33, the source and drain of the transistor N30 are connected between the gate of the first NMOS transistor N3 to be improved and the Vcc. A node 70 is connected to one end of a capacitor Ca, and the back gate of the transistor N30 is connected to Vss.

The other end of the capacitor Ca is connected to a terminal of the output OT1. The gate of the first NMOS transistor N30 is connected to drains of NMOS transistors N31 and N32. The sources of NMOS transistors N31 and N32 are connected to Vss, and the back gates thereof are connected to Vss.

The gate of the NMOS transistor N31 receives an output from the NOR circuit NOR2, and the gate of the NMOS transistor N32 receives an inverted signal $\overline{EN}$ of signal EN.

Accordingly, when the input signal or inverted signal $\overline{EN}$ is at Vcc level, the NMOS transistor N32 is turned on. Irrespective of the input signal IN1, the gate of the NMOS transistor N30 is at Vss level and the transistor N30 is turned off. Thus, there is no problem in which a penetration current flows between Vcc and Vss from the NMOS transistor N30 via the NMOS transistor of the NOR circuit NOR1.

In the case where the input IN1 is at Vcc level when the inverted signal $\overline{EN}$ is at Vss level, since the output of NOR1 is at Vcc level, no penetration current flows through the NOR1 even if the NMOS transistor N30 is turned on. Therefore, there is no problem.

As regards the pull-down unit 33 of FIG. 7, when Vcc=Vss, the Vgs of NMOS transistors N31 and N32 is discharged by parasitic diodes thereof and is substantially 0V to 0.4V. Accordingly, the NMOS transistors N31 and N32 are substantially turned off.

A time point of rise of a pulse applied to the output node OT1 will now be considered. Since the inter-terminal voltage of capacitor Ca is substantially 0V, the level of one end of the capacitor Ca increases with the rise of the pulse. The level of one end of the capacitor Ca is determined by a parasitic capacitance on a node 70, a leak current of NMOS transistors N31 and N32, and the value of the capacitor Ca. If the increased level of node 70 exceeds the threshold voltage of the NMOS transistor N30, the NMOS transistor N30 is turned on abruptly to pull down the gate potential of the transistor N3 to Vss (=Vcc). Thus, the charge injected to the gate is escaped to Vss by the mirror capacitance of the first transistor N3 to be improved, and the breakdown voltage is improved to an avalanche breakdown voltage produced in the case of the absence of injection charge. This operation is performed each time the pulse rises. As a result, a decrease in avalanche breakdown voltage due to the injection charge can be prevented.

According to the third improvement means, 3) in order to prevent an increase in gate potential of the NMOS transistor to be improved, resulting from a mirror capacitance between the gate and drain of this NMOS transistor, the NMOS transistor N30 for pulling down the gate potential to the emitter potential of the parasitic bipolar transistor is connected to the NMOS transistor to be improved. The gate and drain of these transistors are connected via the capacitor Ca. The rising of the signal applied to the drain of the first NMOS transistor N3 to be improved is detected by the capacitor Ca. When the signal rises, the pull-down NMOS transistor N30 is turned on and the charge injected in the gate of the NMOS transistor to be improved is bypassed to the emitter potential. Thereby, the gate potential is controlled so that the Vgs may become 0V, and the decrease in avalanche breakdown voltage can be prevented.

As regards the fourth improvement means or the NMOS transistor N40 of a leak current path cut unit 34, one end of the transistor N40 is connected to the terminal of the output OT1, the gate thereof is connected to Vcc, the other end thereof is connected to one end of the transistor N5, and the back gate thereof is connected to the back gate of the first NMOS transistor N3 to be improved.

The source and drain of the transistor N5 are connected between the node A of the P-well and the other end of the NMOS transistor N40. The gate of the transistor N5 is connected to output node B, and the back gate thereof is connected to the back gate of the NMOS transistor N3.

Since the level of the back gate of the NMOS transistor N40 of the path cut unit 34 is set at Vss, the flowing current is a leak current (off-leak) at the time Vgs=0V.

Even if a large leak current flows because the gate of the back gate voltage compensation transistor N5 is slightly floated due to remaining charge, the leak current is fully reduced by the series-connected NMOS transistor N40. As a result, a decrease in avalanche breakdown voltage due to leak current can be prevented.

Furthermore, since the NMOS transistor N40 is connected to a node of the output OT1, the charge due to mirror capacitance is prevented from being injected into the gate of the first NMOS transistor N3 to be improved, which is commonly connected to the gate of the transistor N5. As a result, a decrease in avalanche breakdown voltage due to injection charge can be prevented.

According to the fourth improvement means, 4) the back gate compensation NMOS transistor N5 is provided between the P-substrate and drain of the first NMOS transistor to be improved. When Vcc=Vss, even if a sub-threshold current occurs in the NMOS transistor N5 due to remaining charge, the NMOS transistor N40, the gate of which is connected to Vcc, is present between the drains of the NMOS transistors N5 and N3. Since Vcc=Vss when the power supply is turned off, the NMOS transistor N40 is turned off.

As has been described above, there is a path through which leak current is injected in the base. By inserting the element (NMOS transistor N40) capable of setting the potential of the current path at Vgs=0V, an off-leak of the NMOS transistor N5 can be surely cut. Thereby, the avalanche breakdown of the first NMOS transistor N3 to be improved, resulting from the off-leak, can be prevented.

The present invention is not limited to the above embodiment, and can be applied variously. For example, in the above-described third improvement means, it is desirable that the capacitor Ca for dealing with the problem of charge injection due to mirror capacitance of the NMOS transistor N3 as shown in FIGS. 6 and 7 be able to reduce the parasitic capacitance on the node 70. The capacitor Ca may be formed by using, e.g. two-layer polysilicon, as shown in FIG. 8.

In the case where the capacitor Ca is formed by using a gate capacitance of the MOS transistor, it is advantageous to form the gate electrode side of the capacitance in a lattice layout, as shown in FIG. 9. Reference numeral 51 denotes a diffusion layer in which drain and source layers are formed. Numeral 52 denotes a lattice-shaped single-layer gate polysilicon electrode, and numeral 53 denotes contact portions for commonly connecting source and drain layers by using an aluminum wiring layer.

For example, the NMOS transistors N10, N20 and N30 may be turned on in the normal operation mode (turn-on mode), if a penetration current between Vcc and Vss and a penetration current between the node of the output OT1 and Vss are ignored. It is desirable, however, that these transistors be turned off. It is desirable that the on-resistance of the NMOS transistor N40 be sufficiently low in the normal operation mode (turn-on time). In the embodiments, the NMOS transistor circuit is employed as circuit of the invention. However, needless to say, PMOS transistors may be similarly used, without departing from the spirit of the invention.

Figure 2:
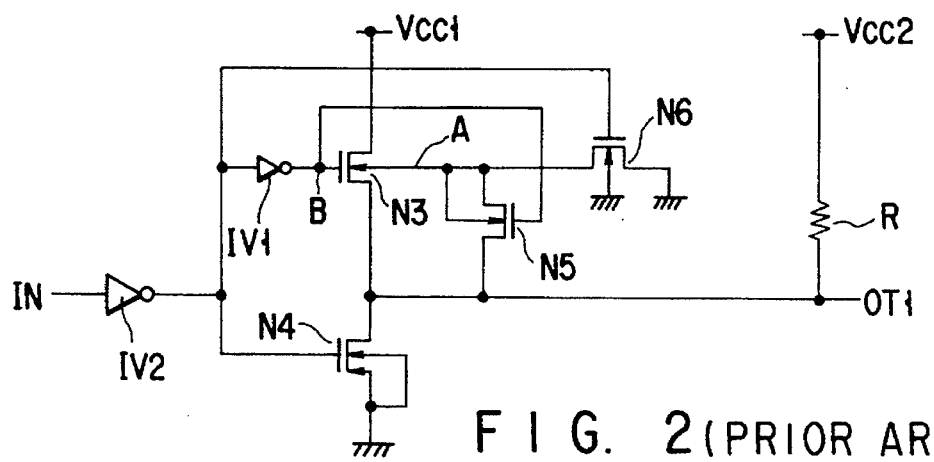
FIG. 2 shows the structure of a conventional non-inversion bi-state output circuit or a transistor circuit apparatus.
Figure 3:
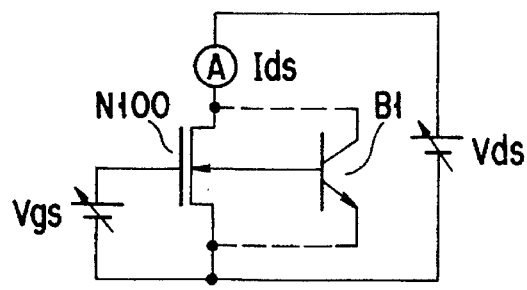
FIG. 3 shows a testing circuit for testing a transistor used in the present invention.

In the present invention, if attention is paid to FIG. 6, the NMOS transistor N4 may be considered to merely pull down the output OT1. Thus, the NMOS transistor N4 is not a necessary element. The NOR circuits of the input circuit are not limited to NOR1 and NOR2. For example, an inverter circuit as shown in FIG. 2 may be used. Although it is desirable to provide all pull-down units 31 to 34 for preventing avalanche breakdown, it is possible to provide them selectively, depending upon circumstances.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A transistor circuit apparatus comprising:

a first MOS transistor to be improved, for preventing an avalanche breakdown of a parasitic bipolar transistor, said first MOS transistor being connected in a channel conductor path provided between one of power supply terminals Vcc and Vss and an output terminal;

a separate circuit connected to said output terminal and driven by a voltage from a separate power supply;

a first pull-down unit including a second transistor connected between one of said power supply terminals Vcc and Vss and a back gate of said first MOS transistor, said second transistor being turned on with an output node of said separate circuit used as power supply when said first MOS transistor remains at a ground potential level with no power supply potential supplied, thereby pulling down the potential level of a back gate node of said first MOS transistor to the level of one of said power supply terminals Vcc and Vss;

a second pull-down unit including a third transistor connected in a channel conductor path provided between one of said power supply terminals Vcc and Vss and a front gate of said first MOS transistor, a front gate of said third transistor being connected to the back gate of the first MOS transistor, said third transistor being turned on by an output of said separate circuit when said first MOS transistor remains at a ground potential level with no power supply potential supplied, thereby pulling down the potential level of the front gate node of said first MOS transistor to the level of one of said power supply terminals Vcc and Vss and turning off said first MOS transistor;

a third pull-down unit including a fourth transistor connected in a channel conductor path provided between one of said power supply terminals Vcc and Vss and the front gate of said first MOS transistor, a front gate of said fourth transistor detecting a potential variation of said output terminal, said fourth transistor being turned on by the output of said separate circuit when said first MOS transistor remains at a ground potential level with no power supply potential supplied, thereby pulling down the potential level of the front gate node of said first MOS transistor to the level of one of said power supply terminals Vcc and Vss and turning off said first MOS transistor; and a path cut unit including a fifth transistor, connected in series between a back gate voltage compensation transistor connected to the back gate of said first MOS transistor and said output terminal, for cutting a path of a leak current.

2. The transistor circuit apparatus according to claim 1, wherein said second transistor is in a turn-off state when said first transistor is being supplied with a power supply potential.

3. The transistor circuit apparatus according to claim 1, wherein said third transistor is in a turn-off state when said first transistor is being supplied with a power supply potential.

4. The transistor circuit apparatus according to claim 1, wherein said fourth transistor is in a turn-off state when said first transistor is being supplied with a power supply potential.

5. The transistor circuit apparatus according to claim 1, wherein a front gate of said fourth transistor is connected to said output terminal via a capacitor.

6. A transistor circuit apparatus comprising:

a first MOS transistor to be improved, for preventing an avalanche breakdown of a parasitic bipolar transistor, said first MOS transistor being connected in a channel conductor path provided between one of power supply terminals Vcc and Vss and an output terminal;

a separate circuit connected to said output terminal and driven by a voltage from a separate power supply; and a pull-down unit including a second transistor connected between one of said power supply terminals Vcc and Vss and a back gate of said first MOS transistor, said second transistor being turned on with an output node of said separate circuit used as power supply when said first MOS transistor remains at a ground potential level with no power supply potential supplied, thereby pulling down the potential level of a back gate node of said first MOS transistor to the level of one of said power supply terminals Vcc and Vss.

7. A transistor circuit apparatus comprising:

a first MOS transistor to be improved, for preventing an avalanche breakdown of a parasitic bipolar transistor, said first MOS transistor being connected in a channel conductor path provided between one of power supply terminals Vcc and Vss and an output terminal;

a separate circuit connected to said output terminal and driven by a voltage from a separate power supply; and a pull-down unit including a second transistor connected in a channel conductor path provided between one of said power supply terminals Vcc and Vss and a front gate of said first MOS transistor, a front gate of said second transistor being connected to the back gate of the first MOS transistor, said second transistor being turned on with an output node of said separate circuit used as power supply when said first MOS transistor remains at a ground potential level with no power supply potential supplied, thereby pulling down the potential level of the front gate node of said first MOS transistor to the level of one of said power supply terminals Vcc and Vss.

8. A transistor circuit apparatus comprising:

a first MOS transistor to be improved, for preventing an avalanche breakdown of a parasitic bipolar transistor, said first MOS transistor being connected in a channel conductor path provided between one of power supply terminals Vcc and Vss and an output terminal;

a separate circuit connected to said output terminal and driven by a voltage from a separate power supply; and a pull-down unit including a second transistor connected in a channel conductor path provided between one of said power supply terminals Vcc and Vss and a front gate of said first MOS transistor, a front gate of said second transistor detecting a potential variation of said output terminal, said second transistor being turned on with an output node of said separate circuit used as power supply when said first MOS transistor remains at a ground potential level with no power supply potential supplied, thereby pulling down the potential level of the front gate node of said first MOS transistor to the level of one of said power supply terminals Vcc and Vss.

9. A transistor circuit apparatus comprising:

a first MOS transistor to be improved, for preventing an avalanche breakdown of a parasitic bipolar transistor, said first MOS transistor being connected in a channel conductor path provided between one of power supply terminals Vcc and Vss and an output terminal;

a separate circuit connected to said output terminal and driven by a voltage from a separate power supply; and a path cut unit including a second transistor, connected in series between a back gate voltage compensation transistor connected to the back gate of said first MOS transistor and said output terminal, for cutting a path of a leak current.

* * * * *